US012785580B2

(12) United States Patent
Bachheibl et al.

(10) Patent No.: US 12,785,580 B2
(45) Date of Patent: Nov. 3, 2026

(54) COOLED HIGH-CURRENT SYSTEM

(71) Applicant: MOLABO GmbH, Ottobrunn (DE)

(72) Inventors: Florian Bachheibl, Ottobrunn (DE); Stefan Rossner, Ottobrunn (DE)

(73) Assignee: MOLABO GmbH, Ottobrunn (DE)

( * ) Notice: Subject to any disclaimer, the term of this patent is extended or adjusted under 35 U.S.C. 154(b) by 202 days.

(21) Appl. No.: 18/286,862

(22) PCT Filed: Apr. 13, 2022

(86) PCT No.: PCT/EP2022/059950
§ 371 (c)(1),
(2) Date: Oct. 13, 2023

(87) PCT Pub. No.: WO2022/219083
PCT Pub. Date: Oct. 20, 2022

(65) Prior Publication Data
US 2024/0195316 A1 Jun. 13, 2024

(30) Foreign Application Priority Data
Apr. 16, 2021 (DE) ........................ 102021203801.8

(51) Int. Cl.
*H02M 7/00* (2006.01)
*H02K 5/15* (2006.01)
(Continued)

(52) U.S. Cl.
CPC .............. *H02M 7/003* (2013.01); *H02K 5/15* (2013.01); *H02K 9/19* (2013.01); *H02K 9/227* (2021.01); *H05K 7/20927* (2013.01)

(58) Field of Classification Search
CPC ........ H02M 7/003; H02M 7/537; H02K 9/08; H02K 9/19; H02K 9/225; H02K 9/227;
(Continued)

(56) References Cited

U.S. PATENT DOCUMENTS 10,236,791 B1 * 3/2019 Chung .................. H02K 5/225
2003/0200761 A1 * 10/2003 Funahashi .......... F04C 29/0085 62/228.4

(Continued)

FOREIGN PATENT DOCUMENTS

CN 201813308 U 4/2011
CN 103733485 A 4/2014

(Continued)

OTHER PUBLICATIONS

International Search Report of Application No. WO2022219083A1, dated Sep. 2, 2022, 5 pages.

(Continued)

*Primary Examiner* — Amir A Jalali
(74) *Attorney, Agent, or Firm* — Morgan, Lewis & Bockius LLP

(57) ABSTRACT

An electric drive comprises a cooled high current system, the electric drive comprising at least one electric machine and at least one inverter having at least one power system adapted to supply power to the at least one electric machine. The power system comprises a busbar system coupled in an electrically conducting manner to a DC power source, at least one capacitor coupled in an electrically conducting manner to the busbar system, at least one semiconductor switch coupled in an electrically conducting manner to the busbar system, and at least one phase terminal coupled in an electrically conducting manner to the at least one semiconductor switch. The at least one part of the at least one power system is coupled in a thermally conducting manner to at least one part of the electrical machine in order to dissipate heat from the at least one part of the at least one power system.

14 Claims, 8 Drawing Sheets

(51) Int. Cl.
*H02K 9/19* (2006.01)
*H02K 9/22* (2006.01)
*H05K 7/20* (2006.01)

(58) Field of Classification Search
CPC .. H02K 3/04; H02K 3/12; H02K 3/50; H02K 3/505; H02K 3/51; H02K 7/085; H02K 7/14; H02K 9/00–06; H02K 11/0094; H02K 11/33; H02K 2211/03; H02K 2203/09; H05K 5/10; H05K 5/13; H05K 5/15; H05K 7/003; H05K 7/085; H05K 7/1432; H05K 7/20272; H05K 7/2089; H05K 7/20927; B60L 50/51; B60L 2210/40; B60L 2220/50; B60K 7/0007; B60K 11/02; H02P 27/06
See application file for complete search history.

(56) References Cited

U.S. PATENT DOCUMENTS

| | | | | |
|---|---|---|---|---|
| 2010/0327654 | A1* | 12/2010 | Azuma | H01L 25/072 307/9.1 |
| 2014/0009016 | A1* | 1/2014 | Seidenbinder | H01L 25/16 310/64 |
| 2015/0357692 | A1 | 12/2015 | Piggott et al. | |
| 2020/0021171 | A1 | 1/2020 | Hidaka | |
| 2020/0185997 | A1* | 6/2020 | Hirasawa | H02K 21/222 |
| 2020/0227334 | A1* | 7/2020 | Hart | H01L 25/115 |
| 2021/0143708 | A1 | 5/2021 | Hattori et al. | |
| 2021/0354746 | A1* | 11/2021 | Kawata | H02K 5/225 |
| 2022/0037963 | A1* | 2/2022 | Zweigle | H02K 5/22 |
| 2022/0131447 | A1 | 4/2022 | Mueller et al. | |
| 2022/0190684 | A1* | 6/2022 | Druant | H02K 9/19 |
| 2023/0179070 | A1* | 6/2023 | Morimoto | B62D 5/0406 310/64 |

FOREIGN PATENT DOCUMENTS

| | | | |
|---|---|---|---|
| DE | 10120414 | A1 | 10/2002 |
| DE | 102008063724 | A1 | 7/2009 |
| DE | 102013221640 | A1 | 4/2015 |
| DE | 112015006036 | T5 | 10/2017 |
| DE | 112017005712 | T5 | 8/2019 |
| DE | 102018221762 | A1 | 6/2020 |
| DE | 102019203399 | A1 | 9/2020 |
| DE | 102019210308 | A | 1/2021 |
| JP | 2016-082603 | A2 | 5/2016 |
| WO | WO201300180 | A2 | 1/2013 |
| WO | WO2020120178 | A | 6/2020 |

OTHER PUBLICATIONS

Office Action dated May 19, 2026 in Chinese Application No., 202280039327.2, 14 pages.

Communication under Rule 71(3) EPC in European Patent Application No. 22722776.6, dated Sep. 21, 2026, 10 pages including translation.

* cited by examiner

COOLED HIGH-CURRENT SYSTEM

TECHNICAL FIELD

The present invention relates to the technical field of electric drives which have a highly integrated construction which is characterised by an integrated construction of an electric drive comprising both at least one electric machine and at least one converter for the electric machine, wherein the power supply of the electric machine is effected via a busbar system of the converter which has to be cooled during operation.

STATE OF THE ART

A cooling system for electric vehicles and methods for operating a cooling system for electric vehicles with a concept for the thermal management of an electric vehicle with a range extender are known. In this case, the components of the electric drive system of the electric vehicle are temperature-controlled by a cooling circuit. The cooling circuit of the electric drive in this case cools the components of the electric drive and also the corresponding components of the associated power electronics, for example of the drive inverter, by the cooling circuit being coupled to the components to be correspondingly cooled (DE 10 2013 221 640 A1).

The requirement to couple the cooling circuit to the components to be cooled via separate cooling channels or cooling circuits provided for cooling is disadvantageous, however, since a multiplicity of corresponding cooling connections therefore have to be provided. As a result, the construction of such a cooling circuit is significantly complicated, which also increases the production time and costs and also the weight and the material requirement in order to produce a drive for electric vehicles cooled in this way. In addition, such solutions have a higher susceptibility to defects on account of the additional cooling circuit connections.

The invention specified in patent claim 1 is based on the problem of minimizing the disadvantages of the use of a cooling circuit, which has to be connected to the components to be cooled, in order to simplify the construction of an electric drive without reducing the performance of the drive in the process. Thus, both an electric machine and a converter for an electric machine each comprise a plurality of electric structural members which generate a high amount of heat which has to be dissipated from all these structural members in order to keep the efficiency and the performance of an electric drive at a high level. In this case, an inverter is essential for an electric drive because, especially in the field of electromobility, in many electric vehicles the electrical energy is stored in battery storage units, which in turn do not supply alternating current but direct current. By contrast, many types of electric machines have to be supplied with alternating current for operation in order to bring about the desired alternating magnetic fields in the electric machines, which leads to the movement of the rotor in the stator of such electric machines. Moreover, very essential factors for dimensioning the quality of electric vehicles are their weight and the power density, the size and the installation space thus required of the drive components of the electric vehicles, for which reason it is an essential aim of the present invention also to reduce the size of the drive components of electric vehicles and in the process to save weight, while the performance of the system is nevertheless as high as possible. A high traction power often requires the presence of high currents in electric drives, which, however, also contributes to increased heating and which are decisive for electric losses and disadvantageously heat the system in the form of heat. Moreover, a compact and space-saving construction of an electric drive increases the density of the components of the construction of an electric drive and also the integration of a plurality of components of an electric drive in one construction, as a result of which a more efficient and more powerful cooling is required. This is because an excessively high temperature leads to the limitation of the applied currents, of the torque generated by the electric drive and also of the generated drive power and also to a reduction in the efficiency of the electric drive.

These problems are solved by the features specified in patent claim 1. Thus, the highly integrated electric drive comprises an electric machine in addition to a converter. Thus, an electric machine of an electric drive can be supplied with alternating current generated by the integrated converter by means of a converter integrated into the electric drive, without further structural members or components being required for this purpose. In addition, the heat which is generated by all the components of the highly integrated electric drive, comprising the integrated converter and the electric machine, is discharged or dissipated by a construction of the electric drive which is optimised for heat dissipation by means of the components of the electric drive itself.

The advantages achieved with the invention are that no elements have to be provided which serve only for cooling structural members of the electric drive and that no separate cooling circuits have to be connected to structural members to be cooled. Instead, cooling is already made possible by the construction within the electric drive itself and thus the cooling of the structural member to be cooled is implemented by redesigning and using already present drive elements. It is thus advantageously possible to save weight, the number of drive components and also material which would be necessary for coupling to the thermal circuit and also the time required for producing these components, as a result of which the costs and the weight of the electric drive are also reduced. Moreover, the quality of the electric drive and also its power density and the torque density are increased by this construction.

Advantageous refinements of the invention are specified in the dependent claims.

In one embodiment, an electric drive comprises at least one electric machine and at least one converter with at least one power system, configured to supply power to the at least one electric machine. The power system comprises a busbar system, which is coupled in electrically conducting manner to a DC power source, at least one capacitor, which is coupled in an electrically conducting manner to the busbar system, at least one semiconductor switch, which is coupled in an electrically conducting manner to the busbar system, and at least one phase terminal, which is coupled in an electrically conducting manner to the at least one semiconductor switch. The at least one portion of the at least one power system is coupled in a thermally conducting manner to at least one portion of the electric machine in order to dissipate heat from the at least one portion of the at least one power system.

In one embodiment, the at least one portion of the electric machine to which the at least one power system is coupled in a thermally conducting manner is a machine shell of the at least one electric machine. Instead or additionally, the at least one portion of the power system can also be thermally coupled to at least one connection lug of the busbar system, which is coupled in a thermally conducting manner to the machine shell. Instead or additionally to the aforementioned, the at least one portion of the electric machine can also be at least one surface-enlarging structure which is arranged on the machine shell. Instead or additionally to the aforementioned, the at least one portion of the electric machine can be a bearing shield of the at least one electric machine. All these variants can be used individually or in any desired combination with one another in order to achieve the object on which the present invention is based.

In one embodiment, the busbar system comprises a DC connection terminal which is coupled in an electrically conducting manner to the DC power source and which comprises a bent extension forming at least one connection lug arranged outside the machine shell of the at least one electric machine. In a further embodiment, the busbar system comprises a DC connection terminal which is coupled in an electrically conducting manner to the DC power source and which comprises a bent extension of the busbar system forming at least one connection lug arranged outside the machine shell of the at least one electric machine in a connection box, wherein the connection box is arranged on the machine shell. As an alternative to the preceding variants, the busbar system can comprise a DC connection terminal which is arranged on the bearing shield and/or a heat sink of the electric machine, which is coupled in an electrically conducting manner to the DC power source and which is arranged on a bearing shield and/or the electric machine. In this case, it is not necessary for the busbar system to comprise a bent extension forming the at least one connection lug for electrical coupling to the DC power source.

In one embodiment, the electric drive comprises at least one galvanic coupling which is coupled in an electrically conducting manner to a DC power source and which is coupled to the busbar system for supplying power. The galvanic coupling can be coupled to the DC connection terminal.

In one embodiment, the electric drive comprises a housing, wherein the at least one electric machine, the at least one converter, at least one connection-side end of at least one galvanic coupling supplying the busbar system with DC power, the busbar system, the at least one capacitor, the at least one semiconductor switch and the at least one phase terminal are arranged in the housing. However, the connection-side end of the at least one galvanic coupling can also be arranged outside the housing and can thus be coupled to an exposed contacting point of the electric drive, wherein the exposed contacting point is sealed off from the remaining components located in the housing by the housing.

In one embodiment, the at least one phase terminal supplies alternating current to at least one slot bar in a stator of the at least one electric machine.

In one embodiment, the busbar system is a DC system.

In one embodiment, the busbar system comprises at least two busbar conductors insulated from one another.

In one embodiment, the at least one phase terminal is coupled in a thermally conductive manner to a bearing shield of the electric machine by a thermally conductive and electrically insulating material. In a further embodiment, the at least one phase terminal is coupled in a thermally conductive manner to a heat sink of the electric machine by a thermally conductive and electrically insulating material. However, both embodiments can be combined and the phase terminal can be coupled in a thermally conductive and electrically insulating manner to a heat sink and a bearing shield of the electric machine.

In one embodiment, an O-ring seals the thermally conductive and electrically insulating material with which a phase terminal is coupled in a thermally conductive manner to a bearing shield of the electric machine with respect to a section of the phase terminal extending from the O-ring in the direction of a stator of the at least one electric machine.

In one embodiment, the power system is cooled by the at least one capacitor and via the bearing shield.

In one embodiment, the bearing shield is coupled in a thermally conducting manner to the at least one capacitor by a thermal interface material, TIM, and the at least one capacitor is coupled in a thermally and electrically conducting manner to the busbar system.

In one embodiment, the power system is cooled via the bearing shield by the at least one semiconductor switch, which is coupled in a thermally conducting manner to the bearing shield.

In one embodiment, the at least one semiconductor switch is coupled in a thermally and electrically conducting manner to the busbar system.

In one embodiment, the at least one semiconductor switch is coupled in a thermally conducting manner to a heat sink.

In one embodiment, the at least one electric machine comprises a machine casing, which forms part of the wall of a housing of the electric drive.

In one embodiment, the bearing shield is magnetically non-conductive and thermally conductive.

In one embodiment, the power system is actively cooled by a heat sink with cooling channels. Instead or additionally, the power system can be actively cooled by a surface-enlarging structure which is arranged on a bearing shield of the electric machine. The active cooling of the surface-enlarging structure can be effected by the flow of a fluid, such as a gas, a liquid and/or a cooling medium.

In one embodiment, the busbar system is directly cooled by a non-conductive, liquid cooling medium.

In one embodiment, the busbar system is cooled by an actively cooled machine shell. Additionally or instead, the busbar system is cooled by an actively cooled bearing shield of the electric machine.

In one embodiment, the insulation between the busbar conductors of the busbar system comprises channels for cooling the busbar conductors. The channels can comprise walls which are defined in part by the busbar system and in part by the insulation between the busbar conductors of the busbar system. A cooling medium which is suitable for absorbing heat and which thus cools the busbar conductors can be guided through the cooling channels.

In one embodiment, the at least two busbar conductors of the busbar system are at least two conductors lying on top of one another, wherein conductors of the at least two conductors lying on top of one another lying closer to a heat sink each comprise recesses through which the conductors of the at least two conductors lying on top of one another, which each lie further away from the heat sink than the conductors lying closer to the heat sink, are thermally coupled directly to the heat sink. In this case, therefore, each conductor lying closer to the heat sink can comprise recesses which make possible the direct thermal coupling of one or more conductors lying further away to the heat sink.

In one embodiment, at least one galvanic coupling which couples the DC power source in an electrically conducting manner to the power system is thermally coupled to the power system and is cooled via at least one portion of the electric machine.

The preceding summary is provided to summarize some embodiments in order to provide a basic understanding of the aspects of the subject matter described herein. Accordingly, the features described above should not be interpreted as limiting the scope of the subject matter described herein. Furthermore, the above and/or further embodiments can be combined in any suitable combination in order to provide further embodiments. Further features, aspects and advantages of the subject matter described herein will become apparent from the following detailed description, the drawings and the claims.

DRAWINGS

In order to describe the manner in which the embodiments of the invention described above are implemented as well as to define other advantages and features of the disclosure, a more precise description is provided below. In the accompanying drawings, aspects of the description are illustrated, wherein like numerals denote like elements. With the understanding that these drawings illustrate exemplary embodiments of the invention and are therefore not to be considered as limiting in scope, the embodiments are explained in more detail below with additional details through the use of the accompanying drawings.

DETAILED DESCRIPTION

Figure 1:
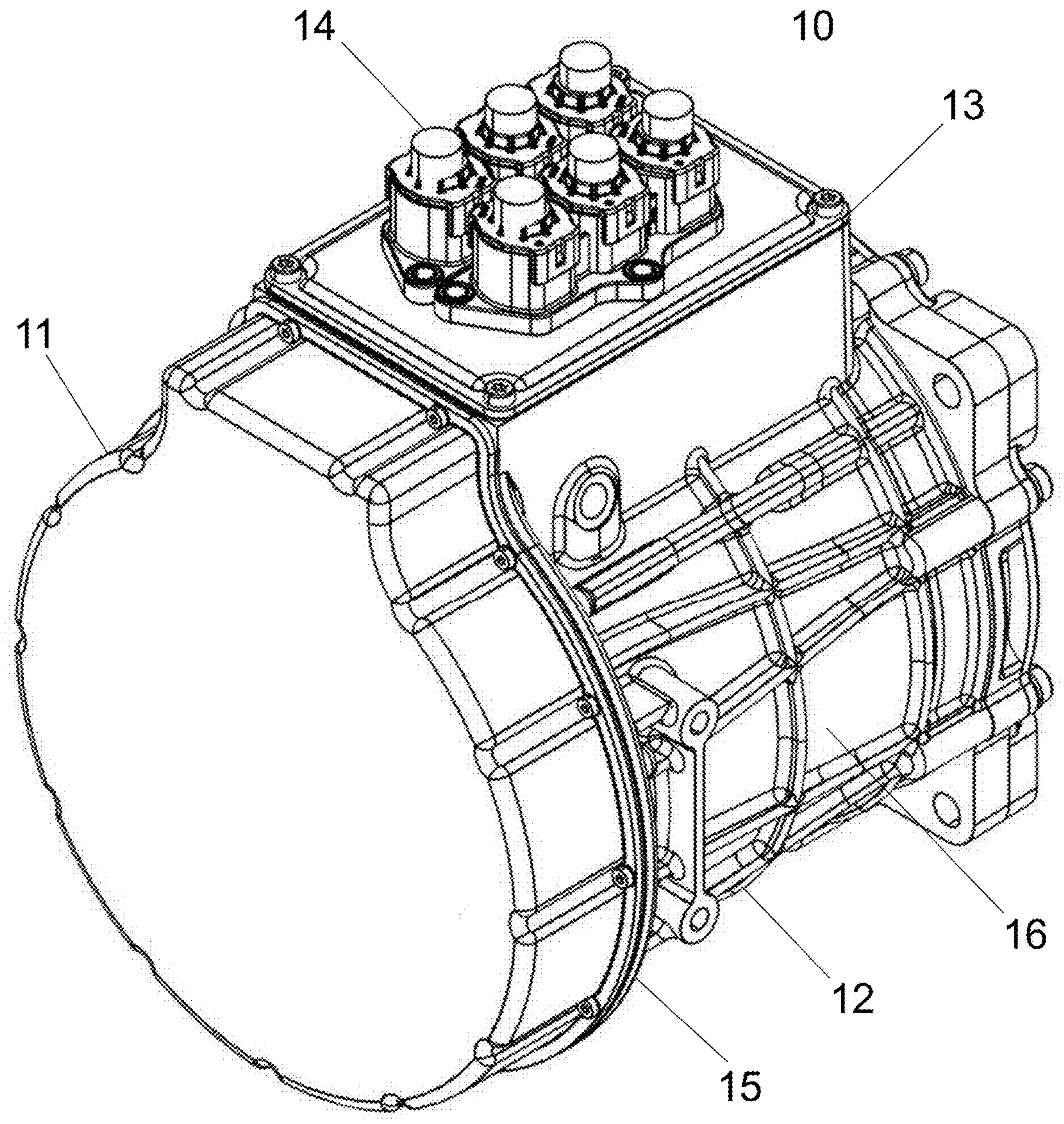
FIG. 1 shows an electric drive in a perspective view.

The explanation of the invention follows with reference to the drawings according to the construction and mode of operation of the illustrated invention. The present disclosure is to be understood better in view of the following explanations:

An electric vehicle is to be understood to mean any vehicle which has an electric drive and which uses this at least in part, as in hybrid vehicles, or alone, as in vehicles with exclusively one or more electric drives, for driving the vehicle. Thus, boats or ships, motor vehicles such as cars, buses or trucks, as well as aircraft such as airplanes, drones or helicopters, rail vehicles or other vehicles falling under these categories, but also small vehicles such as electric scooters, electric bicycles can be understood as electric vehicles. This list is not to be understood as a concluding description, but merely mentions exemplary forms of vehicles which, if they have an electric drive, are to be understood as electric vehicles.

In the present case, an electric machine, also referred to as a motor, is to be understood to mean an electric machine which is used mainly in motor operation as a drive, but which can also be used in generator operation, such as for recuperating energy. An electric machine in the sense of a motor of the present invention comprises a rotor and a stator with slots, wherein the slots of the stator are not filled with windings which usually consist of a plurality of turns of a wire winding, such as a copper wire winding, but with bars. These bars are solid metal elements which, unlike conventional wire windings, almost completely fill the slots. They consist of solid material and have a high degree of rigidity, such that they are not deformed in a slot during the joining process. In the technical sense, a slot bar corresponds to a winding with a number of turns equal to ½. However, a slot bar is more robust and stable than a wire winding and a slot bar is produced as a solid metal structural member, for example by an extrusion process or by another process suitable for this purpose, such as a casting process, extrusion, cold forming or punching. The bar can be produced from aluminum or any other conductive metal, such as copper, or else from another electrically conductive material, such as graphite.

A connection box is to be understood as meaning a structural member or housing or a part of a drive housing, which comprises components for producing an electrically conductive coupling between electrical conductors or with components which are located outside the drive.

A DC connection terminal is to be understood as meaning an electrically coupling structural member which makes it possible to supply an electrical or electronic circuit connected to the DC connection terminal with DC power. This can be a plug-in, screw, clamping, welding or other connection which is suitable for producing an electrically conductive coupling between two electrical conductors. The connection can be embodied both releasably and non-releasably.

A machine shell is to be understood as meaning a wall or a part of a housing which encases an electric machine. The machine shell can serve for the mechanical arrangement and fastening of the components of the electric machine and thus constitutes part of an electric machine or of an electric drive.

A busbar system is to be understood as meaning a circuit which uses a busbar as a basic element. A busbar is also referred to as an omnibus bar. A busbar is to be understood as meaning an arrangement of conductors which serve as a central distributor of electrical energy. All incoming and outgoing conductors, which are supplied with energy by the busbar system, are coupled to this conductor arrangement. A busbar conductor is consequently to be understood as meaning a busbar or an omnibus bar of the busbar system. A terminal lug is to be understood as meaning part of a busbar or of a busbar system which enables the electrical connection of an external energy source to the busbar system.

A phase terminal is to be understood as meaning part of an electric machine which supplies alternating current to power electronics of the converter of an electric drive, such as semiconductor switches of the converter, with at least one phase current branch of the electric machine, which in turn can comprise at least one slot bar or a wire winding. The phase current branch or slot bar is arranged in a stator of the electric machine.

A bearing shield is to be understood as meaning the rear or the front cover of an electric machine which protects the machine interior against contact and which accommodates the bearing of the shaft end of the rotor, that is to say the bearing shield bears the mechanical load of the rotor A semiconductor switch, also referred to as an electronic switch or analogue switch, is to be understood as meaning a constituent part of an electronic circuit which implements the function of an electromechanical switch. In this case, field-effect transistors, FETs, and bipolar transistors and diodes can be used as switching elements. In combination with series resistors, bipolar transistors in switching applications are also referred to as digital transistors. In addition, thyristors and semiconductor relays can also be understood as semiconductor switches.

An electrical coupling, also referred to as an electrical connection or electrically conducting coupling or connection, is to be understood as meaning a coupling of elements, components or structural members in a way which leads to electrical signals and currents and voltages being able to be exchanged or conducted between the elements, components or structural members coupled in this way. Thus, an electrically conductive coupling can serve for supplying an electronic structural member and can serve for closing an electrical circuit between corresponding structural members or elements. The coupling itself is effected using a material which is an electrical conductor or semiconductor and which mechanically connects the components, elements or structural members to be coupled to one another. Instead of an electrical coupling, reference can also be made to a galvanic line.

A surface-enlarging structure is to be understood as meaning a configuration of a component which has a larger surface area than a component without the surface-enlarging structure. For example, a surface-enlarging structure can be understood as meaning cooling ribs, pins, elevations, openings, holes and domes which are arranged on the component surface and which thus supplement the shell surface of the component by the shell surface of these ribs, pins, elevations, openings, holes or domes. A surface-enlarging structure can thus serve for the improved cooling of the component, since the convection area over which heat can be dissipated is increased.

A thermal coupling, also referred to as a thermal connection or thermally conducting coupling or connection, is to be understood as meaning a coupling of two elements or structural members in a way which leads to heat being able to be exchanged or conducted efficiently between the coupled structural members, components or elements. Whether an efficient heat exchange or an efficient heat conduction is possible depends in particular on the thermal conductivity and also the convection or contact area between the thermally coupled or connected structural members, elements or components. In general, it applies that a thermal coupling composed of a material having a high thermal conductivity can have a smaller contact or convection area than a thermal coupling composed of a material having a low thermal conductivity, in order to make efficient heat conduction possible. In this case, the thermal coupling serves the purpose of cooling heat-generating or heat-loaded structural members, components or elements, in order to protect these from overheating and in order to improve the service life, efficiency and performance. Moreover, the number of capacitors which are required can be reduced in the case of improved cooling, as a result of which the costs are advantageously reduced and as a result of which the performance weight is increased. On the basis of these reasons, it should be taken into account regarding the present invention that not every general electrical coupling or connection between structural members, elements or components can already be understood as a thermal coupling between these structural members, elements or components, even if many electrical conductors have a good thermal conductivity. This is because an electrical coupling or connection serves primarily the purpose of the electrical coupling and the typical material cross section of electrical couplings or connections is chosen such that the convection or contact area of the electrical coupling or connection is too small to make a sufficient contribution to an efficient heat dissipation. This is decisive for the present invention in so far as the described structural members, components or elements are subject to high currents and electrical powers or are operated, which leads to the generation of correspondingly high heat quantities which cannot be dissipated by any electrical coupling. However, an electrical coupling or connection can then make a sufficient heat dissipation for the present invention and can thus be regarded as a thermal coupling in the sense of the present invention if it has a larger convection or contact area, wherein a larger convection or contact area is meant than that of a typical electrical coupling. For the present invention, it is only necessary to deviate from this understanding of thermal coupling if this is described differently at the appropriate place.

A high current system is to be understood as a system which operates with high currents and low voltages. The electric drives and machines described here can thus be operated with high currents and low voltages. In one example, such a low voltage can be a range of below 100 volts, preferably below 60 volts, or also 48 volts and any desired even lower voltage. The invention is, however, not limited thereto and voltages and currents deviating therefrom are also possible in order to achieve the power suitable for the respective application.

FIG. 1 shows an electric drive 10 in a perspective view. The electric drive 10 comprises a converter 11 which is arranged as an integrated part in the electric drive 10. It is thus an integrated converter which is arranged in the housing 15 of the electric drive 10. The integrated arrangement of the converter 11 makes it possible for the electric drive 10 to be configured in a particularly compact manner. This is because converters are usually used as separate or external devices, so that a further housing, circuit elements and electrical coupling elements would be required, which in turn all take up installation space. This leads to a greater space requirement of the drive system and also to a higher system weight. Both are disadvantageous, in particular also in use for electric vehicles of any type.

The electric drive 10 also comprises an electric machine 12 which is a motor integrated into the electric drive 10. Although an electric machine is usually mentioned below in order to simplify the description, the electric drive 10 according to the present invention can also comprise a plurality of electric machines and is not limited to one electric machine. An electric machine 12 comprises at least one rotor and one stator. Slots through which phase current branches run are provided in the stator. The phase current branches serve to generate a magnetic field which changes permanently on account of the alternating current present in the phase current branches. In the case of an asynchronous machine, as a result of the change in the field in the rotor of the electric machine, voltages are induced which bring about currents, which brings about the rotation of the rotor and thus the movement of the electric machine. In the case of a synchronous machine, as a result of the change in the field between rotor and stator, a magnetic energy is produced which the system attempts to minimize as a result of rotation of the rotor. The mode of operation of an electric machine 12 is known to the person skilled in the art, however, and will therefore not be described further at this point, and the electric machine 12 is neither limited to an asynchronous machine nor to a synchronous machine, but can be such a machine. Although a converter 11 is usually mentioned below in order to simplify the description, the electric drive

10 according to the present invention can also comprise a plurality of converters and is not limited to one converter.

The electric drive 10 also comprises a connection box 13 which is arranged on the machine shell 16 of a housing 15 of the electric drive 10. In this case, the machine shell 16 constitutes the housing wall of the housing 15 in the region of the electric machine 12. The connection box 13 serves for the connection of the electric drive 10 to one or more external energy sources which are not illustrated in the drawings. For this purpose, at least one galvanic coupling 14, such as a cable which originates from one or more DC sources, such as a battery or a battery system of an electric vehicle, is coupled to the connection box 13 and the electrical connections present therein. Thus, the electric drive 10 can be supplied with direct current which is then converted by the inverter 11 into an alternating current in order to supply the phase current branches of the electric machine 12 with alternating current. Although a plurality of cables and corresponding connections of the connection box 13 are illustrated in FIG. 1, any desired number of cables, such as also only one cable or more than one cable, can be used. If only one cable is used, this does not mean that only one phase can be connected by means of the cable, since a polyphase or a multipole cable, such as a coaxial cable, can also be used. The housing 15 of the electric drive 10 can house at least one electric machine 12, at least one converter 11, a busbar system 20, at least one capacitor 60, at least one semiconductor switch 70 and at least one phase terminal 30. For supplying with current, the electric drive 10 comprises within the housing 15 a power system with a busbar system 20, which is explained in more detail below. Instead of a cable, however, the galvanic coupling 14 can also be any other suitable conductor, such as a busbar conductor, a busbar system or another supply line. For these variants, the aspects described above with respect to the cable can be applied analogously.

Figure 2:
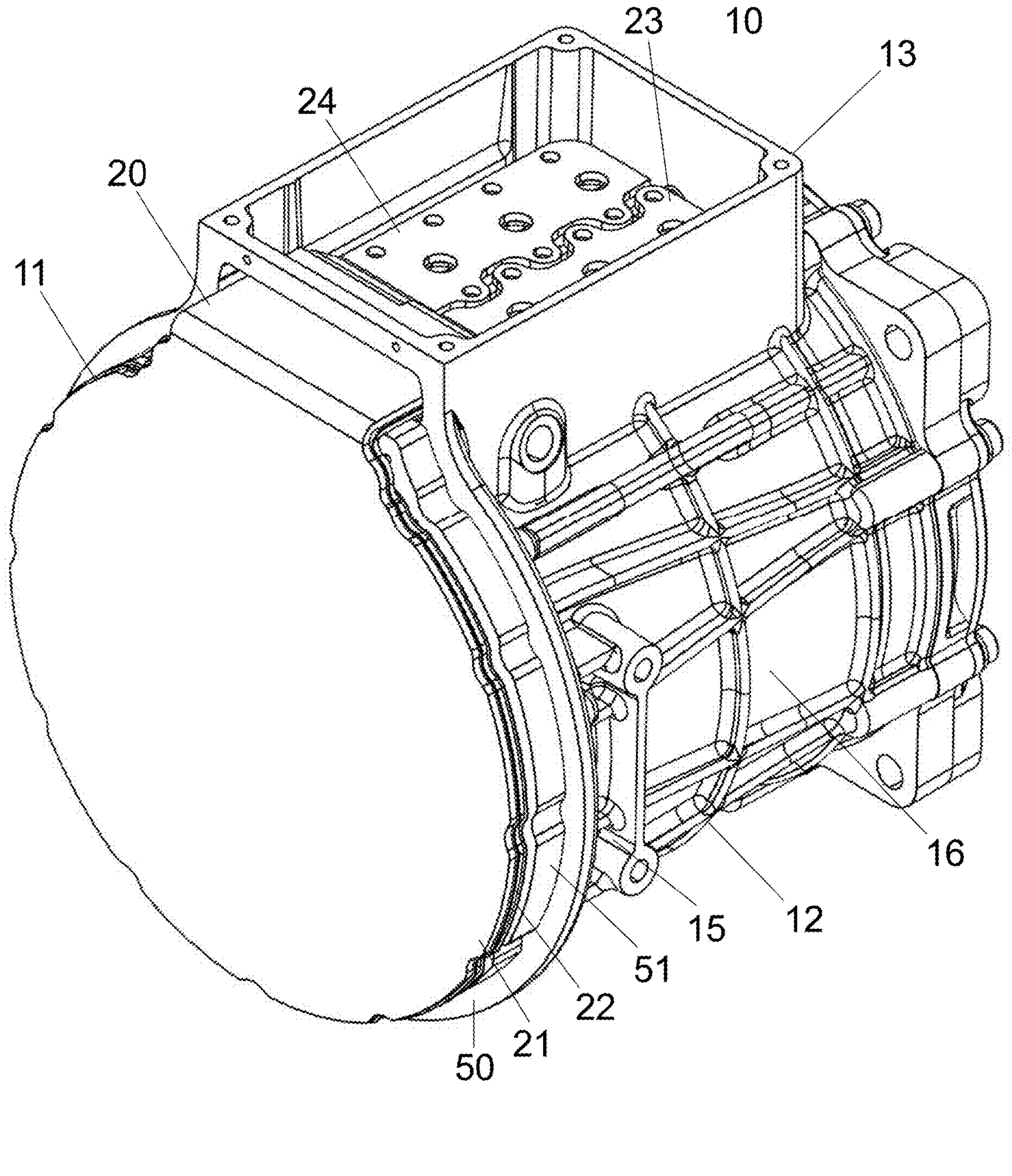
FIG. 2 shows a part of a power system of an electric drive with a remote part of a connection box and with a housing part remote at the converter in a perspective view.

FIG. 2 shows an electric drive 10 with a remote part of a connection box 13 and with a housing part remote at the converter 11 in a perspective view. The part of the connection box 13 remote with respect to FIG. 1 comprises the cover of the connection box 13 with the connections for at least one galvanic coupling 14. As a result, a view into a part of the interior of the connection box 13 is possible, wherein connection box 13 can have further components in addition to the components illustrated in FIG. 2. In addition, the part of the housing 15 which encases the front part of the electric drive 10 and under which the converter 11 is arranged is remote in FIG. 2. As a result, a view onto a part of the converter 11 is possible, wherein converter 11 can have further components in addition to the components illustrated in FIG. 2.

In one embodiment of the invention, the power system can comprise a busbar system 20, at least one capacitor 60, at least one semiconductor switch 70, which can be arranged on an assembly 43, and at least one phase terminal 30. In the sense of the invention, the power system constitutes the energy supply system for the at least one electric machine 12. Thus, the power system also comprises components or structural members which can be considered as part of the converter 11 or of the electric machine 12 and which serve for the current flow from an external power source to phase current branches of the stator 42 of the at least one electric machine 12.

FIG. 2 illustrates part of a power system of the electric drive 10, which comprises a busbar system 20 of the electric drive 10. The busbar system can comprise a front busbar conductor 21, a rear busbar conductor 22, a front busbar terminal lug 23 and a rear busbar terminal lug 24, but is not limited thereto and can instead also be formed without terminal lugs, such that the electrical coupling to an energy-supplying source can be effected directly to the busbar system. In both cases, the busbar system 20 can be coupled in an electrically conducting manner to a DC power source. Likewise, the busbar system 20 can comprise more than two busbar conductors. In one embodiment of the present invention, the busbar system 20 is a DC system, such that the terminal lugs 23 and 24 can each form a positive and a negative pole of the DC system and such that the busbar conductors form one of the two positive and negative phases of the DC system. If more than two terminal lugs are used, a plurality of positive and/or negative poles/phases are correspondingly possible. Both the busbar conductor 21 and the busbar conductor 22 can form either a positive or a negative phase of the DC system.

In order to form one or more terminal lugs 23, 24, the busbar system 20 can comprise a bent extension, wherein the bent part of the extension forms at least one terminal lug, as illustrated in FIG. 2. This part of the busbar system 20 can form a DC connection terminal which is coupled in an electrically conducting manner to a DC power source. The bend of the busbar system is illustrated in FIG. 2 with a right angle of 90°, but the angle can also deviate therefrom. The thus bent part of the busbar system 20 with the at least one terminal lug 23, 24 can run outside the machine shell 16 of the at least one electric machine 12 and thus be guided into a connection box 13 arranged on the machine shell 16, as illustrated in FIG. 2. By means of such an arrangement, the at least one terminal lug 23, 24 of the busbar system 20 can be coupled to the machine shell 16, as a result of which cooling of the at least one terminal lug and thus of part of the busbar system 20 and of the power system can be achieved via the machine shell 16. In other words, the at least one terminal lug 23, 24 can be thermally coupled to the machine shell 16 such that there is efficient cooling of the terminal lugs and of the busbar system 20 on account of a heat conduction potential sufficient for this purpose.

Deviating therefrom, the bent part of the busbar system 20, in contrast to the illustration in FIG. 2, can also not be arranged in a connection box 13. In such a case, the electric drive 10 can be configured without a connection box 13. The busbar system 20 with at least one terminal lug 23, 24 is exposed in this case, such that easier accessibility for a connection means can be achieved. In this case too, the at least one terminal lug 23, 24 can be thermally coupled to the machine shell 16 according to all aspects and embodiments described here, in order to achieve efficient cooling of the at least one terminal lug 23, 24.

For this purpose, the at least one terminal lug 23, 24 has a surface which is oriented substantially parallel in the direction of the machine shell 16 and which advantageously increases the heat conduction potential with respect to the machine shell 16 as a contact or convection area. This is illustrated in FIG. 2, according to which the terminal lugs 23, 24 in one embodiment each comprise a surface which is oriented substantially parallel to the machine shell 16. As a result of the substantially parallel orientation, the contact or convection area between the terminal lugs 23, 24 and the machine shell 16 is advantageously enlarged. Since the machine shell 16 in one embodiment has substantially a cylindrical shape, the terminal lugs 23, 24 can be configured in a correspondingly curved shape, which corresponds to the curvature of the machine shell surface, in order to further maximize the contact area.

In FIG. 2, however, the terminal lugs are not illustrated in a curved manner. In such an embodiment, the terminal lugs can be thermally coupled to the machine shell 16 by at least one surface-enlarging structure which is arranged between the terminal lugs 23, 24 and the machine shell 16. As a result, the contact or convection area between the terminal lugs 23, 24 and the machine shell 16 can advantageously be increased and the surface-enlarging structure can moreover itself form convection areas which advantageously increase the cooling effect both in a passive and in an active cooling manner. The surface-enlarging structure is, however, not absolutely necessary for the present invention and a sufficient cooling can also be brought about without this.

The at least one terminal lug 23, 24 of the busbar system 20 can also be coupled in a thermally conducting manner to at least one surface-enlarging structure which is arranged on the machine shell 16, irrespective of whether the terminal lugs are configured in a curved manner or not, that is to say in any embodiment. As a result, the cooling effect can be further increased compared with the sole coupling of the at least one terminal lug 23, 24 to the machine shell 16, since the surface-enlarging structure itself serves as a passive or active coolant, as a result of which the surface area for convection, that is to say for heat transfer, is further increased.

The machine shell 16 can serve as a passive cooling element which, like a radiator, emits heat via its surface by convection or surface convection. On the other hand, the machine shell can also be actively cooled. An active cooling of the machine shell is, however, not absolutely necessary for achieving an advantageously cooling effect. In this embodiment, the machine shell 16 and the bearing shield 50 can be formed in such a way that they run as close as possible to and parallel to the busbar system 20 over a large area. A thermal interface material, TIM, can produce heat conduction between the busbar system and machine shell 16 or bearing shield 50 formed in this way.

In addition, the at least one terminal lug can couple the busbar system 20 to a DC power source, such that a thermally conductive connection also exists between the terminal lug and a means by which the DC power source is connected. In such an embodiment, the means to which the DC power source is connected can also be cooled by the terminal lug and the machine shell 16. This is particularly useful for high-current systems, as the high current to be conducted in these can also cause the connection means to heat up considerably, which has the disadvantage of reducing the electrical efficiency and the efficiency of the electric drive 10. The connection means can be at least one galvanic coupling 14, such as a cable, but also any desired number of galvanic couplings 14 or cables. The more galvanic couplings are used, the smaller the cross section of these can be, as a result of which the individual galvanic couplings are more flexible and therefore better deformable. By using a plurality of flexible galvanic couplings instead of a few and therefore stronger and less flexible galvanic couplings, the electric drive 10 can advantageously be installed in a space-saving manner, since the bending radius of the galvanic coupling, such as a cable, is smaller. Irrespective of the number of galvanic couplings 14, however, these can be configured as a connection means for a high current system overall, that is to say the overall cross section of a thicker galvanic coupling or of a plurality of thinner galvanic couplings, with a conductor cross section which is so high that the cross section of the at least one galvanic coupling 14 of a high current system alone is sufficient to bring about efficient heat dissipation from the at least one galvanic coupling 14 by the electrical coupling of the at least one galvanic coupling 14 to the at least one terminal lug 23, 24 of the terminal box 13. It is thus advantageously possible, in an embodiment in which the terminal lugs 23, 24 or the busbar system 20 have a thermal coupling to at least one component which is suitable for cooling the terminal lugs 23, 24 or the busbar system 20, also for the connection means, such as the at least one galvanic coupling 14, to be cooled efficiently, which reduces the losses in the connection means or the galvanic coupling 14 and thus increases the efficiency of the electric drive 10.

Instead of a bent extension, the busbar system 20, in contrast to the illustration in FIG. 2, can also comprise a DC connection terminal arranged on a bearing shield 50 or a heat sink 51 of the electric machine 12. In this case, it is not necessary for the busbar system to comprise a bent extension forming at least one connection lug 23, 24 for electrical coupling to the DC power source. The cooling of the busbar system 20 and thus of part of the power system can be effected here by the bearing shield 50 or the heat sink 51. As already described above with respect to the machine shell 16, the bearing shield 50, but also the heat sink 51, can also be passively or actively cooled. Thus, the DC power source, which in this variant is coupled to the DC connection terminal, can also be cooled by the DC connection terminal connected to the bearing shield or the heat sink. This makes it possible, analogously to the preceding embodiment, for the connection means, such as the at least one galvanic coupling 14, to be advantageously cooled by the bearing shield 50 or the heat sink 51 of the electric machine 12. In addition, in this embodiment, it is also possible for only the busbar system 20 without DC connection terminal 20 to be arranged on the bearing shield 50 or the heat sink 51, wherein the preceding aspects can be applied analogously to this and apply to this. Finally, the embodiments explained above can also be connected to one another, with the result that the busbar system 20 can also be arranged on the heat sink 51, which in turn can be arranged on the bearing shield 50 of the electric machine 12, or vice versa. In these variants too, the embodiments described above are compatible with one another. Consequently, the busbar system 20 and/or the DC connection terminal can be arranged both on the bearing shield 50 and at the same time on the heat sink 51, or vice versa.

According to the present invention, the power system has to be thermally coupled by at least one of its portions to a portion of the electric machine 12, with the result that heat can be dissipated from the power system into the coupled portion of the electric machine 12. This can be achieved by means of the embodiments described above, that is to say using the machine shell 16 or the bearing shield 50 of the electric drive 12 as a portion of the electric machine 12 to which at least one portion of the power system, such as the busbar system 20 or the terminal lugs 23, 24, is thermally coupled. However, one possibility of cooling does not exclude another possibility of cooling described here. By means of the combination of a plurality of cooling possibilities, the cooling and thus efficiency of the electric drive 10 can advantageously be further increased. Therefore, the machine shell 16, at least one terminal lug 23, 24 of the busbar system 20, at least one surface-enlarging structure on the machine shell 16 and the bearing shield 50 can also be used together or in any desired combination with one another for cooling the power system. However, it is sufficient to thermally couple a portion of the power system to a portion of the electric machine 12 in order to achieve a sufficient cooling effect. Therefore, by means of the thermal coupling of a plurality of portions instead of in each case only one portion, the cooling effect is increased, with the result that the efficiency and the effectiveness of the electric drive 10 is thus advantageously increased.

The busbar conductors 21 and 22 are illustrated in the accompanying drawings as plate-shaped conductors which have a substantially round cross section. However, the busbar conductors can also be configured in any desired shape deviating from the round cross section and also in a manner deviating from the plate shape. Thus, the conductors 21, 22 can be configured in the form of one or more bars with sections running in a straight, bent or curved manner, or in another shape which is suitable for carrying currents and for coupling further electronic structural members to the busbar system 20. However, it has to be ensured in each embodiment that the configuration of the busbar conductors of the busbar system enables simple electrical coupling of all the structural members or components of the electric drive 10 to be supplied with current. For this purpose, it is advantageous if the busbar system 20 has conductors with a large cross section or large surface area, since the busbar system has firstly to be able to transport all the electrical power and secondly has to provide the connection with a multiplicity of electronic/electrical structural members or circuits. This is ensured by the plate shape illustrated in FIG. 2, since electrical couplings are enabled over the entire plate area and since the conductor cross section is thus sufficiently high to also provide high currents and large powers with low losses, that is to say with low line resistances.

The busbar system 20 can be coupled to different electronic structural members of the electric drive 10. Thus, at least one capacitor 60 and/or at least one semiconductor switch 70 can be coupled in an electrically conducting manner to the busbar system 20. In this case, the electrical coupling can be effected by a material which, in addition to an electrical conductivity, also has a thermal conductivity. If an electrically and thermally conductive material is used, a heat-conducting function can also be fulfilled at the same time by the busbar system 20, in addition to its basic function of supplying the electronic structural members connected thereto with current. Consequently, in the case of an architecture which enables the dissipation of heat from the busbar system 20, the busbar system 20 can serve at the same time as a heat-dissipating means. It can thus be achieved that all electronic structural members which are connected to the busbar system 20 are efficiently cooled without further measures for cooling these structural members, such as a connection of separate elements of a cooling circuit or of another cooling system. As a result, it is advantageously achieved that the structural members which are installed in a highly integrated electric drive such as the electric drive 10 of the present invention with integrated converter 11 and integrated electric machine 12 can also be cooled in a very space-saving, lightweight and compact manner, which leads to an increase in the efficiency and the performance of the electric drive 10. This moreover simplifies the construction and the production of the electric drive 10 since many heat-generating structural members of the electric drive are difficult to access for separate cooling means. In addition, such a construction increases the reliability of the electric drive since it comprises less structural members which can become defective during operation, during which vibrations or movements cause mechanical loads, which at the same time simplifies the maintenance of such an electric drive 10.

The above-described architecture which enables the dissipation of heat from the busbar system 20 can be achieved by the thermal coupling of the busbar system 20 in one of the manners described above or below to one or more parts of the electric machine 12, namely the machine shell 16, the bearing shield 50, a surface-enlarging structure which is arranged on the machine shell 16, at least one heat sink 51 which is arranged on the bearing shield 50, or by any desired combination of the thermal coupling to these parts of the electric machine 12. Alternatively or additionally, the at least one portion of the at least one power system can be coupled in a thermally conducting manner to at least one terminal lug 23, 24 of the busbar system 20, which is coupled in a thermally conducting manner to the machine shell 16, in order to achieve a thermal coupling.

In addition, in one embodiment of the present invention, the at least two busbar conductors 21 and 22 of the busbar system 20 can be two conductors lying on top of one another, which are electrically insulated from one another by an insulation. In order that the at least two busbar conductors of the busbar system can nevertheless be cooled well, in one embodiment of the present invention a busbar conductor 22 of the conductors lying on top of one another abutting a heat sink can comprise recesses through which the at least one conductor 21 of the at least two busbar conductors not abutting the heat sink is thermally coupled directly to the heat sink. A heat sink 51 can serve as a heat sink against which the rear bus bar conductor 22 rests, which can be in contact directly, i.e. directly, or indirectly, i.e. through a thermally conductive connection with the bus bar conductor 2. Alternatively or additionally, a bearing shield 50, which can be suitable, like the heat sink 51, as an actively or passively cooled component for dissipating heat, can also serve as the heat sink. If the rear busbar conductor 22 comprises recesses, the one or more busbar conductors lying above the rear busbar conductor 22, like the busbar conductor 21 in FIG. 2, can also be brought into direct or indirect contact with the heat sink through these recesses. For this purpose, the at least one busbar conductor 21 may comprise a deformation or a separate thermally conductive element, resulting in immediate, i.e. direct, or indirect, i.e. designed by the thermally conductive coupling element, thermal coupling with the heat sink. This is advantageous in particular because, in the embodiment in which an electric insulator is arranged between the busbar conductors of the busbar system 20, a good thermal coupling between the busbar conductors can be at least impaired or prevented by the insulator. In other words, at least two busbar conductors 21, 22 can be at least two conductors lying on top of one another, wherein conductors 22 of the at least two conductors lying on top of one another lying closer to a heat sink each comprise recesses through which the conductors of the at least two conductors lying on top of one another, which each lie further away from the heat sink than the conductors lying closer to the heat sink, are thermally coupled directly to the heat sink.

For the present invention, it is not necessary for the heat sink to be an actively or passively cooled element. Instead, the heat sink can also serve only as a heat buffer which can absorb a certain amount of heat on account of its thermal mass, as a result of which a certain cooling effect is achieved. If a heat sink 51 or a bearing shield 50 is used as the heat sink, the heat sink or the bearing shield can serve either passively or actively as a heat-dissipating element. As a passive element, the heat sink can be provided with at least one surface-enlarging structure in order to increase the surface available for surface convection. If the heat sink 51 or the bearing shield 50 serves as an active cooling element, the latter can likewise be provided in each case with at least one surface-enlarging structure via which a fluid, such as a gas or a liquid, additionally flows. An active heat sink or an active bearing shield can, however, also be configured without surface-enlarging structures and nevertheless have an efficient cooling effect. This can advantageously simplify the construction and advantageously reduce the overall size. Alternatively or additionally, an actively cooled heat sink or an actively cooled bearing shield can have cooling channels through which a cooling medium, such as a fluid, is guided in order to absorb heat and to dissipate the latter. The cooling channels can be part of a cooling circuit in which the absorbed heat of the cooling medium is dissipated from the cooling medium via a radiator, compressor or a similar device suitable for cooling, before the latter is guided again to the heat sink or the bearing shield. It should, however, be emphasized once again that an active cooling, regardless of the form or in which structural member of the electric drive 10, is not absolutely necessary for the present invention.

In one embodiment in which an insulator is arranged between the at least two busbar conductors 21 and 22, the insulation between the busbar conductors can comprise channels for cooling the busbar conductors, wherein the channels comprise walls which are defined in part by the busbar system 20 and in part by the insulation, and wherein a cooling medium, such as a fluid, is guided through the cooling channels. Thus, in one embodiment, an insulator can be actively cooled between busbar conductors of the busbar system 20. This can be carried out either together with or as an alternative to the embodiment described above, according to which the busbar conductors not arranged on a heat sink can be coupled indirectly or directly to the heat sink by means of recesses in the busbar conductors lying between them and the busbar conductors lying on the heat sink. The combination of these cooling possibilities of the busbar conductors of the busbar system 20 leads to an advantageously increased cooling effect, but this is not absolutely necessary for the present invention.

Figure 3:
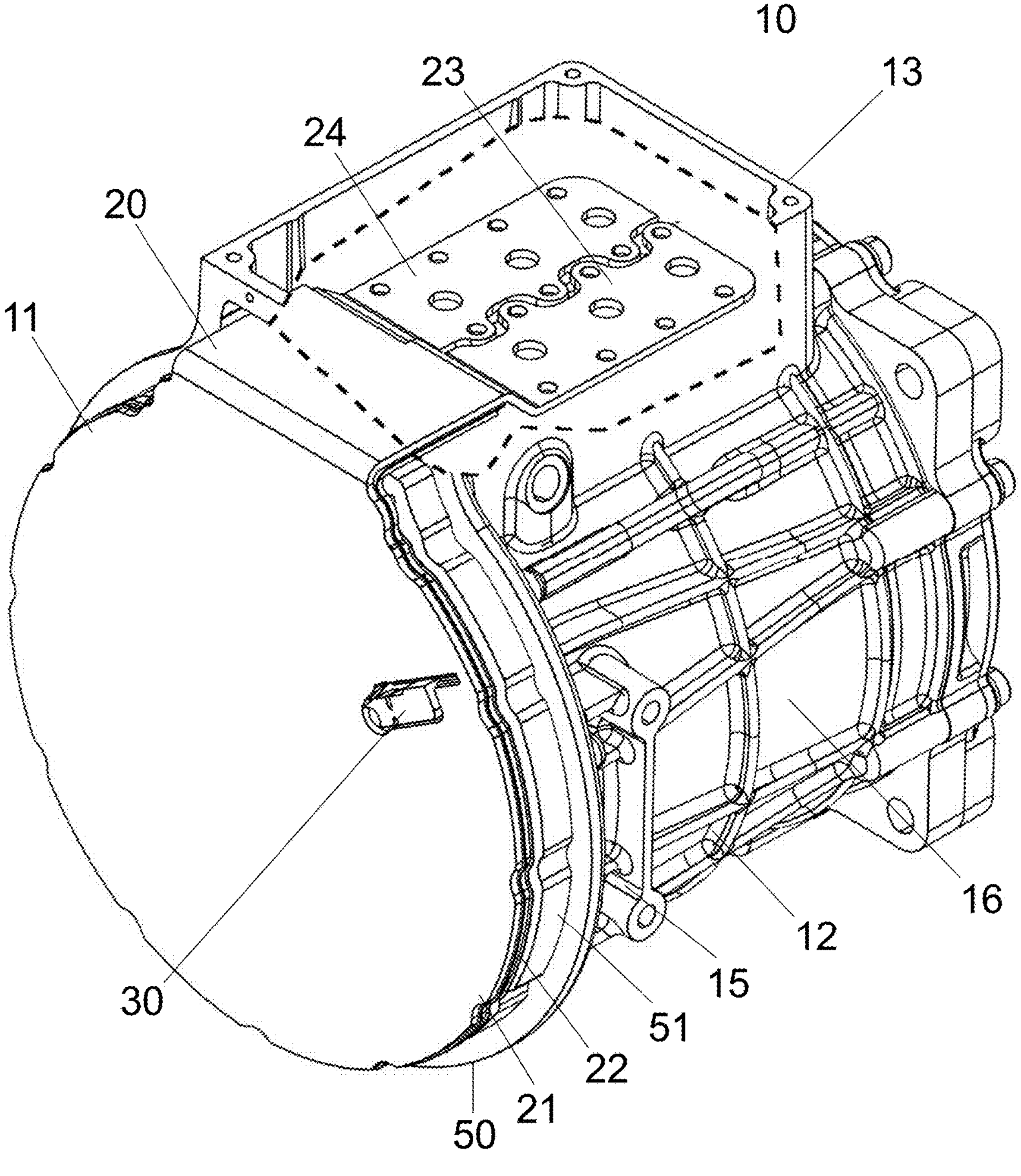
FIG. 3 shows a part of a power system of an electric drive with a remote part of a connection box and with a housing part remote at the converter in a perspective sectional view.

FIG. 3 shows an electric drive 10 with a remote part of a connection box 13 and with a housing part remote at the converter 11 in a perspective sectional view. In this case, compared to the illustration of FIG. 2, a section through the connection box 13 is present along the drawn-in dashed line. As a result, what has already been explained with reference to FIG. 2 is further clarified, in particular with regard to the configuration of the at least one terminal lug 23 and 24. As can be seen in FIG. 3, the busbar system 20 can not only have, as described above, a bend by 90 degrees which leads the two busbar conductors 21 and 22 to the connection box 13, but the part bent in this way can constitute a further extension which, by means of a further bend in the region of the connection box 13, leads the at least one terminal lug 23, 24 in the connection box 13 back into the vicinity of the machine shell 16. This simplifies both indirect and direct thermal coupling between the busbar system 20, that is to say a portion of the power system, by means of the at least one terminal lug 23, 24 to a portion of the electric machine 12, that is to say the machine shell 16.

In addition, FIG. 3 illustrates that, in one embodiment of the present invention, the at least one terminal lug 23, 24 can each assume half the width of the bent part of the busbar system 20. As a result, both the terminal lug 24, illustrated on the left in FIG. 3, of the rear busbar 22 and the terminal lug 23, illustrated on the right in FIG. 3, of the front busbar 21 can be arranged next to one another at the same height. This also simplifies the indirect or direct thermal coupling of the terminal lugs 23 and 24, and thus of the busbar system 20 and also of a portion of the power system, to a portion of the electric machine 12 suitable for cooling, such as the machine shell 16. In addition, the electrical coupling between at least one galvanic coupling 14, which, as illustrated in FIG. 1, can be connected from above to the cover of the connection box 13, is simplified toward the at least two terminal lugs 23 and 24, since the terminal lugs in this way do not lie above one another like the at least two busbar conductors 21 and 22, as a result of which a second terminal lug would conceal the at least one first terminal lug lying therebelow. However, the terminal lugs do not have to be configured in such a divided manner and can instead lie above one another. In such a case, the electrical coupling between the at least one galvanic coupling 14 and the concealed lugs has to be released in some other way. For example, the terminal lugs could comprise openings or recesses through which an electrical coupling can be achieved. However, this can make a more complex electrical insulation necessary. In such a configuration, a bolt for contacting can be pressed into the upper terminal lug, which bolt likewise has to be electrically insulated. In this case, the lower terminal lug can be recessed at this point, or the bolt terminates flush with the underside of the upper plate. For the lower plate, a hole or a recess has to be placed in the upper plate so that contacting by the bolt is possible. Instead of a bolt, another element suitable for electrical coupling could also be used. The embodiment illustrated in FIG. 3 is completely compatible with the embodiments and features which were described above with respect to FIG. 2, with the result that the aspects of the embodiments of FIGS. 2 and 3 can be combined with one another as desired.

In addition, part of a phase connection 30 is illustrated in FIG. 3. In addition to this phase connection 30, however, a multiplicity of phase connections can also be arranged adjacent to the illustrated phase connection and distributed over the cross section of the converter 11, which phase connections are not illustrated in FIG. 3. The at least one phase terminal 30 serves for supplying an alternating current generated by at least one semiconductor switch 70 to a phase current branch of the electric machine 12. The phase terminal 30 can be led out via the busbar 21 in order to measure the phase current, such that a Hall sensor, which can be arranged on a printed circuit board or a printed circuit board which can still be arranged in front of the front busbar 21, can be arranged in the effective region of the magnetic field which surrounds the phase terminal 30. This simplifies a phase current measurement.

Figure 4:
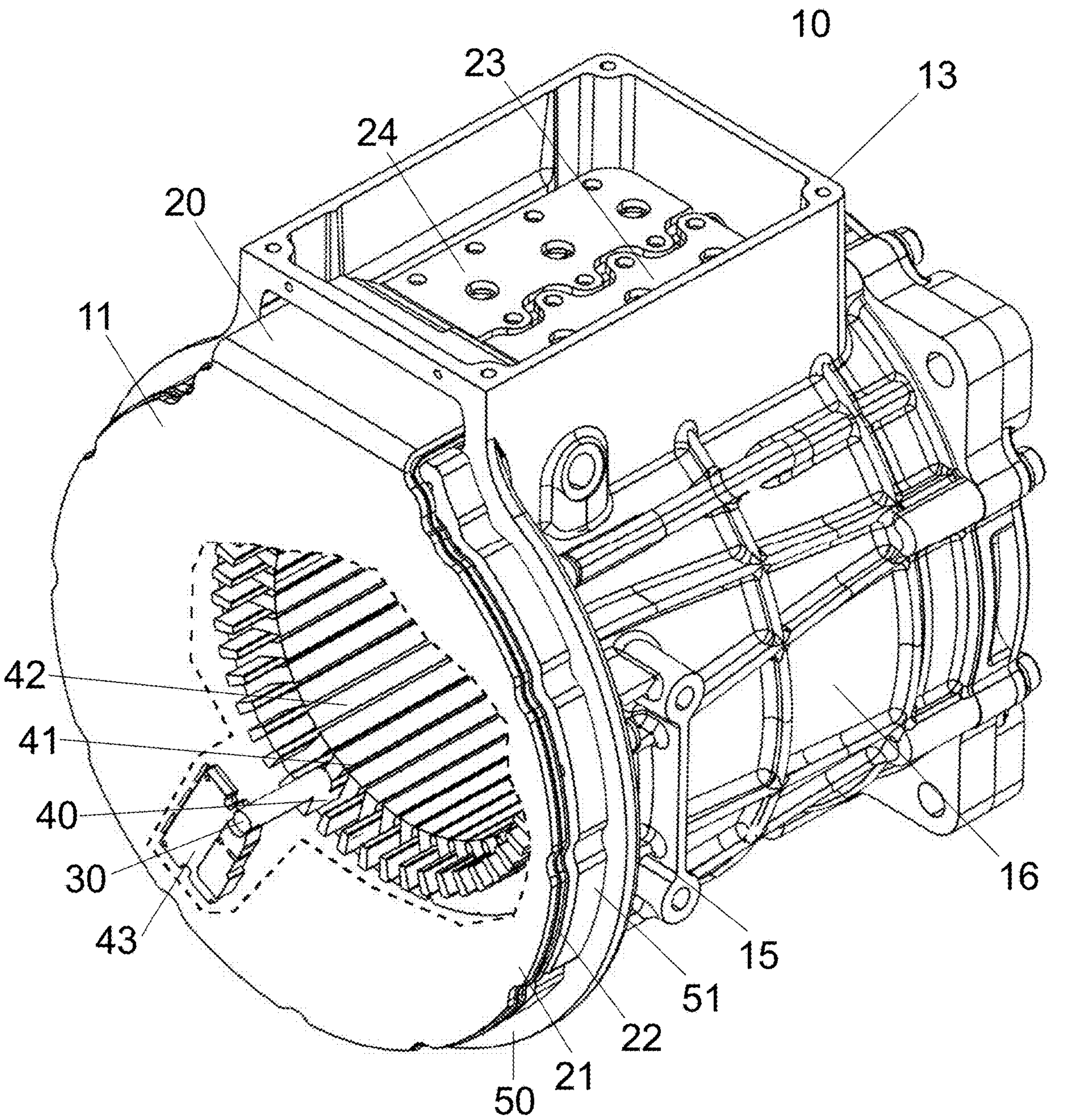
FIG. 4 shows a part of a power system of an electric drive with a remote part of a connection box and with a housing part remote at the converter in a further perspective sectional view.

FIG. 4 shows an electric drive 10 with a remote part of a connection box 13 and with a housing part remote at the converter 11 in a further perspective sectional view. In contrast to FIG. 3, the section through some elements of the converter 11 is carried out in FIG. 4, with the result that a view of the stator 42 of the electric machine 12 is made possible. Thus, FIG. 4 illustrates a slot bar 40 which has a phase terminal 30 in the direction of the converter 11 and is arranged in a slot 41 of the stator 42 in an opposite direction to the stator 42. As illustrated in FIG. 4, in one embodiment of the invention, the phase terminal 30 can be of bar-shaped form and can be electrically coupled directly to at least one slot bar 40. Since the phase terminal 30 has a large cross section and has a surface which runs substantially parallel to a surface of that end of the slot bar 40 which is guided out of the slot 41 and which is coupled to the slot bar 40, the coupling between the phase terminal 30 and the slot bar 40 is additionally suitable for thermally coupling these two components to one another such that an efficient heat-dissipating effect is achieved by the thermal coupling.

FIG. 4 additionally illustrates that, in one embodiment, the at least one phase terminal 30 has not only the part illustrated in FIG. 3 and guided out via the busbar conductors 21, 22, but rather that it additionally comprises a bar-shaped part which has been described above and which can be coupled to at least one slot bar 40 of the stator 42. These two parts of the phase terminal 30 do not have to represent separate structural members and can be an integral component. The part of the phase terminal 30 guided out via the busbar conductors can be a solid metal structural member, which rests on an assembly 43, which is described further below and which comprises at least one semiconductor switch 70 to which the phase terminal can be coupled by the part guided out via the busbar conductors 21, 22, in order to conduct an alternating current generated by the at least one semiconductor switch 70 to a phase current branch of the stator 42, which comprises at least the slot bar 40.

The stator can have further elements (not illustrated in FIG. 4) which electrically and/or thermally couple further slot bars, which are arranged in further slots of the stator 42, to the slot bar 40, with the result that a plurality of slot bars can also be supplied with alternating current by the phase terminal 30.

In one embodiment of the invention, the assembly 43 can be in direct or indirect contact or lie against a heat sink, such as the heat sink 51 or the bearing shield 50. This achieves efficient cooling of the assembly 43, which comprises the at least one heat-generating and cooling-requiring semiconductor switch 70. If the phase terminal 30, as illustrated in FIGS. 3 and 4, has a part with a shape which forms a surface which runs substantially parallel to a surface of the assembly 43, a contact or convection area between the assembly 43 and the phase terminal 30 can additionally enable an efficient cooling effect in addition to an electrical coupling to the semiconductor switches 70. Since the semiconductor switches 70 are thermally coupled to a heat sink, such as the heat sink 51 or the bearing shield 50, both the phase terminal 30 and the assembly 43 with the at least one semiconductor switch can consequently advantageously be cooled. This simultaneously enables efficient cooling of the at least one phase current branch of the stator 42, which can be electrically and also thermally coupled to the phase terminal 30, as described above. Each of these cooling possibilities can be used in any desired combination with one another. In addition, such an arbitrary embodiment of the cooling of the assembly 43 can be combined with the further cooling possibilities described above in order to further improve the cooling effect.

The at least one semiconductor switch 70 of an assembly 43 is additionally electrically coupled to the busbar system 20, as a result of which the at least one semiconductor switch 70 can be supplied with DC power, which can be converted into alternating current for operating the electric machine 12. However, the electrical coupling of the semiconductor switches 70 to the at least two busbar conductors 21, 22 of the busbar system 20 can additionally enable a thermal coupling between the busbar conductors and the semiconductor switches of the assembly 43 if the coupling elements 71 have a surface which enables a sufficient cooling effect, which is explained further with respect to FIG. 7.

Alternatively or additionally, in one embodiment of the present invention, the assembly 43 and/or the at least one semiconductor switch 70 can be in direct contact with one or with a plurality of busbar conductors 21, 22 of the busbar system 20. This enables a thermal coupling between the at least one semiconductor switch 70 and the busbar system 20 also to be achieved in this way. Such a coupling serves exclusively for thermal coupling and not for electrical coupling and can advantageously increase the contact or convection area available for heat dissipation between the busbar system 20 and the at least one semiconductor switch 70. This embodiment is compatible with and can be combined with all of the preceding embodiments. In particular, as described above, the at least two busbar conductors 21, 22 can have recesses which make it possible for not only the rear busbar conductor 22 but also all busbar conductors 21 present there to be thermally coupled to the assembly 43 or to the at least one semiconductor switch 70.

Figure 5:
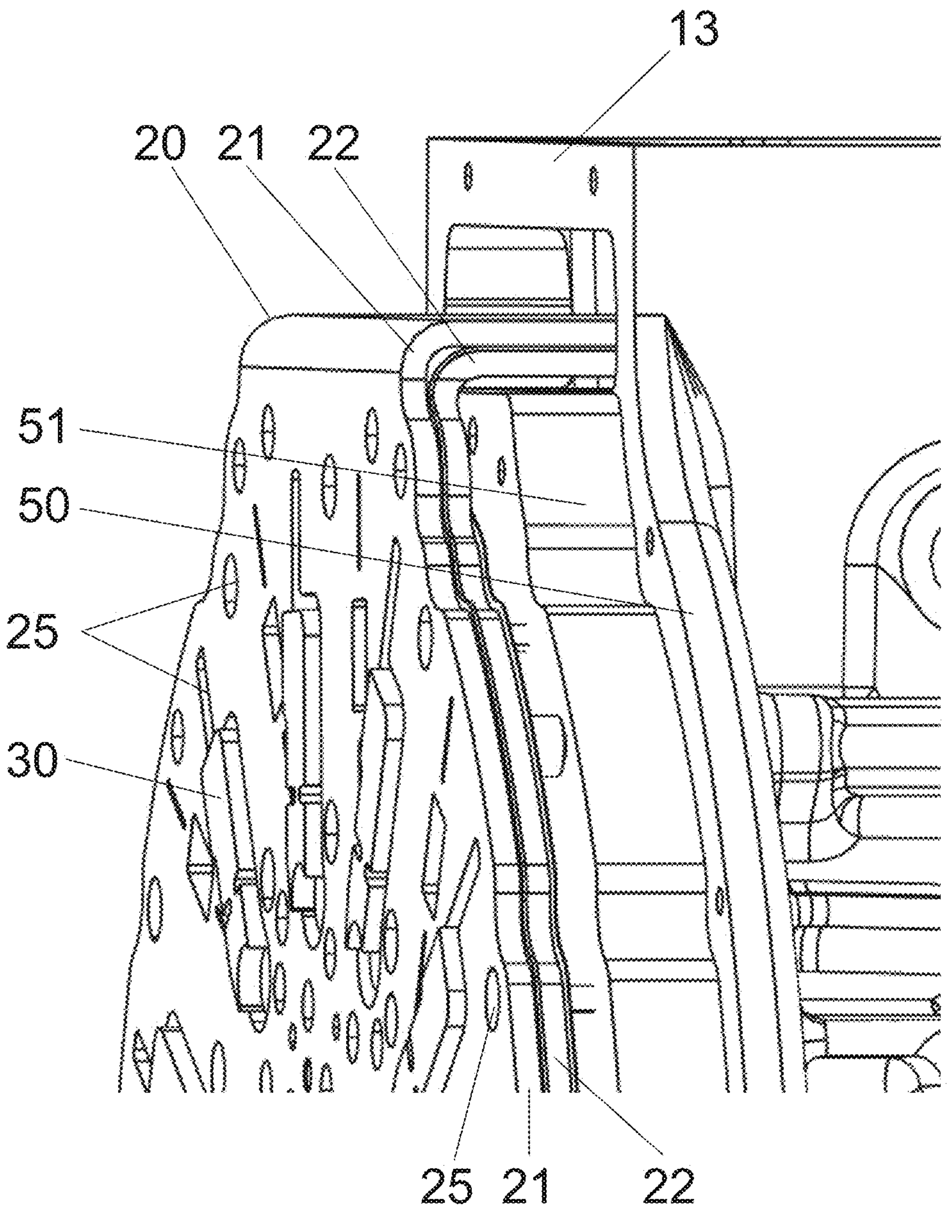
FIG. 5 shows a part of an electric drive in a perspective view.

FIG. 5 shows a part of an electric drive 10 in a perspective view. FIG. 5 shows a plurality of openings 25 which, for heat dissipation, enable indirect or direct thermal coupling of the busbar conductors 21, 22 to at least part of the electric machine 12, such as a heat sink 51 or a bearing shield 50, and/or to an assembly 43 and/or at least one semiconductor switch 70. However, the openings or recesses 25 could also be configured in a different number or in a different shape. In addition, these can be used alternatively or additionally for electrical coupling.

Figure 6:
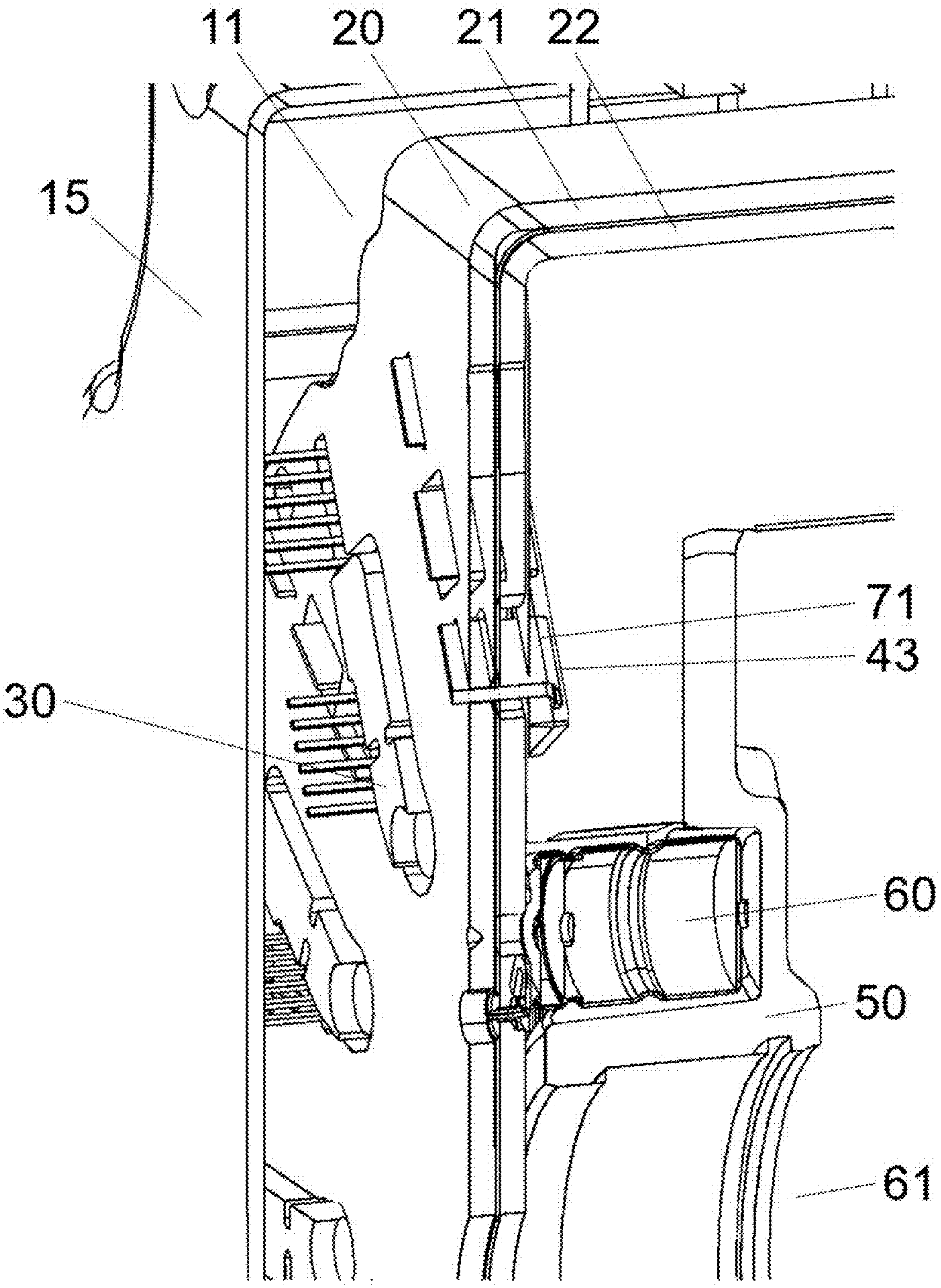
FIG. 6 shows a part of an electric drive in a perspective sectional view.

FIG. 5 also shows an embodiment in which two busbar conductors 21, 22 of the busbar system 20 are arranged lying on top of one another. The busbar conductors 21, 22 can lie directly against assemblies 43 (not illustrated in FIG. 5), as shown in FIG. 6, which in turn can lie directly against a heat sink 51 which lies against a bearing shield 50. The heat sink 51, the bearing shield 50 and the assemblies 43 can each represent part of the electric machine 12 which can be coupled thermally to at least part of the power system for heat dissipation. As illustrated in FIG. 5, the electric drive 10 can comprise more phase connections than just one phase connection 30 and each of the phase connections can be coupled to an assembly 43 (not illustrated in FIG. 5) comprising at least one semiconductor switch 70.

In one embodiment of the invention, the assembly 43 or the at least one semiconductor switch 70 can be arranged at a different location in the electric drive 10. In this embodiment, at least one busbar conductor 21, 22 of the busbar system 20 can lie directly against part of the electric machine 12, such as the heat sink 51 or the bearing shield 50, and therefore produce a thermal coupling between the power system and the corresponding part of the electric machine 12 which is suitable for efficiently cooling the power system and the busbar system 20. In this case, the heat sink 51 can have an integrally formed step which extends to an adjacent busbar conductor. A TIM is arranged between the heat sink and the applied busbar conductor and electrically insulates the busbar conductor from the heat sink, but produces a thermal coupling between them. A busbar conductor which is located above the adjacent busbar conductor and is further away from the heat sink can then be thermally coupled by a further step in the heat sink, wherein the thickness of the further step is defined by the thickness of the underlying busbar conductor plus the thickness of the TIM layers between the busbar conductors. Alternatively, the adjacent busbar conductor can be configured to be recessed in order to configure the busbar conductor lying above it such that it lies at the height of the lower busbar conductor in the region of the recess.

FIG. 6 shows a part of an electric drive 10 in a perspective sectional view. In one embodiment of the invention, the assembly 43 can be electrically and thermally coupled directly to at least one busbar conductor 21, 22 of the busbar system 20 by semiconductor switch terminals 71. For this purpose, the semiconductor switch terminals 71 have a large surface area, as illustrated, which can make an efficient heat transfer between the busbar conductors 21, 22 and at least one semiconductor switch 70. Alternatively or additionally to this, the assembly 43 or the at least one semiconductor switch 70 can bear directly against at least one of the busbar conductors 21, 22 and, as a result of which a thermal coupling is formed.

In one embodiment of the invention, at least one capacitor 60 of the power system, which is illustrated in section in FIG. 6 by the sectional view, can also be arranged adjacent to at least one busbar conductor 21, 22 of the busbar system 20. The power system of the electric drive 10 can, however, also comprise a multiplicity of capacitors which can be arranged distributed over the cross section of the electric drive, for example around a rotation axis 61 of the electric machine 12. The at least one capacitor 60 has to be electrically coupled to at least one of the busbar conductors 21, 22. Furthermore, the at least one capacitor 60 can also be thermally coupled to at least one busbar conductor 21, 22. Furthermore, the at least one capacitor 60 can additionally or alternatively be thermally coupled indirectly or directly to a bearing shield 50 of the electric machine 12 on the side facing in the direction of the stator 42, that is to say with its top side. Furthermore, the at least one capacitor 60 can additionally or alternatively be thermally coupled indirectly or directly to a heat sink 51 of the electric machine 12, which is not shown in FIG. 6, on its lateral shell surface. Furthermore, the at least one capacitor 60 can additionally or alternatively be thermally coupled indirectly or directly to a bearing shield 50 of the electric machine 12 on the part of its lateral shell surface facing the stator 42 of the electric machine 12. If, in a variant described above, or in any desired combination of these variants, the at least one capacitor 60 is thermally coupled to a portion of the electric machine 12, such as the bearing shield 50 or the heat sink 51, the at least one capacitor 60 can advantageously be cooled by this portion of the electric machine 12 by the heat of the at least one capacitor 60 being dissipated into the corresponding portion of the electric machine 12.

In one embodiment of the invention, the at least one capacitor 60 can be electrically coupled to the busbar system 20 by connection pins. If the connection pins additionally have a contact or convection area which runs substantially parallel to a surface of the busbar conductors 21, 22 of the busbar system 20 and which have a sufficient cross section, the connection pins of the at least one capacitor 60 can additionally enable a thermal coupling between the busbar system 20 and the capacitor. In this case, the busbar system 20 can be advantageously cooled by the at least one capacitor 60 and at least part of the electric machine 12 which is suitable for heat dissipation, such as the bearing shield 50 or the heat sink 51.

Figure 7:
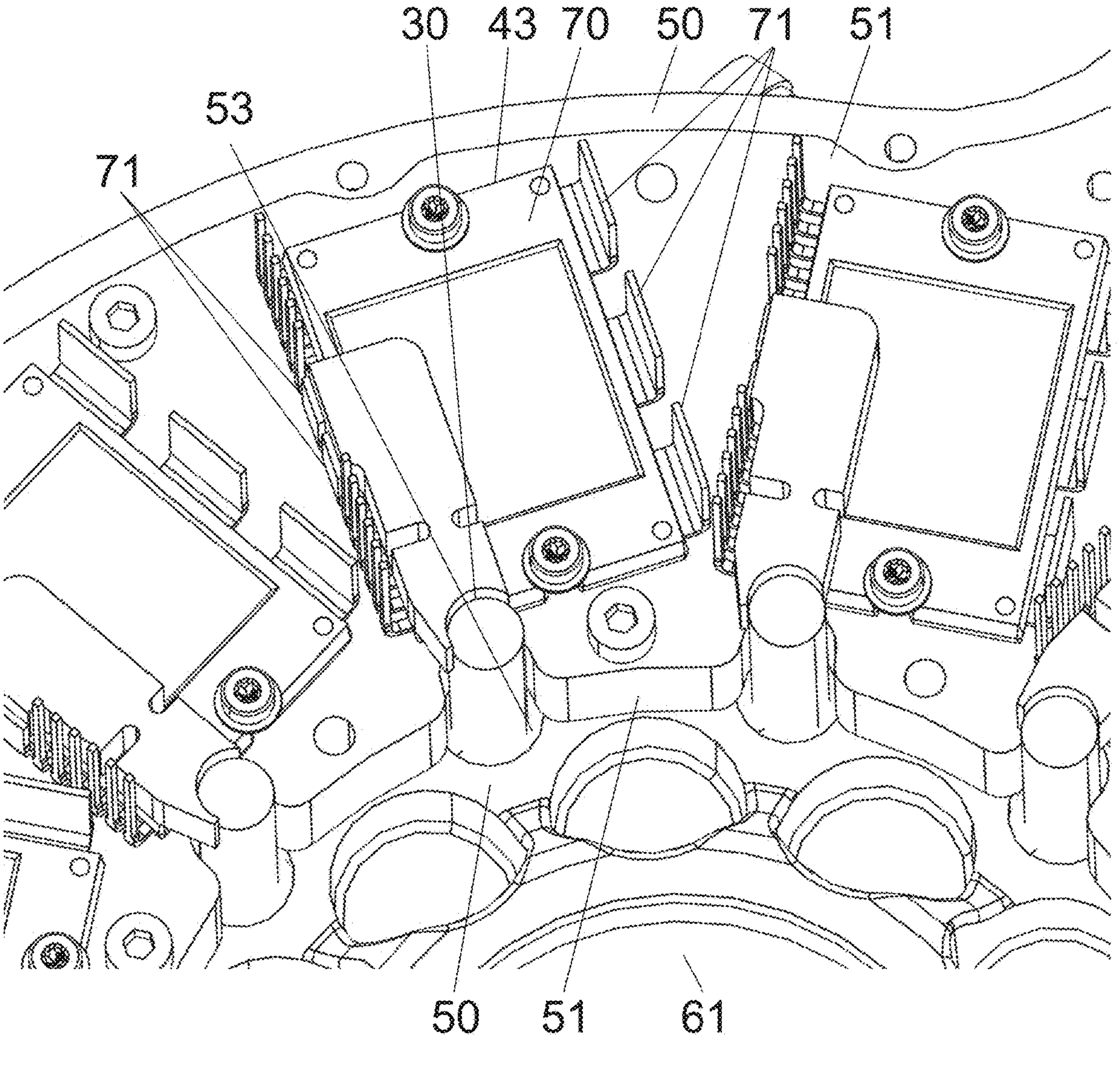
FIG. 7 shows a part of an electric drive in a perspective view.

FIG. 7 shows a part of an electric drive 10 in a perspective view. In one embodiment of the invention, the at least one phase terminal 30 can be thermally coupled to part of the electric machine 12. For this purpose, a bar-shaped part of the at least one phase terminal 30 can run through a tunnel-shaped opening in the bearing shield 50 of the electric machine 12. FIG. 7 illustrates a section of this part of the phase terminal 30 which is led out of the tunnel-shaped opening of the bearing shield 50. Within the tunnel-shaped opening in the bearing shield, an O-ring 52 which completely encloses the bar-shaped part can be arranged around the bar-shaped part of the at least one phase terminal 30. The O-ring 52 is not illustrated in FIG. 7 (see FIG. 8). The space between the bar-shaped part of the at least one phase terminal 30 and the tunnel-shaped opening of the bearing shield 50 can be sealed off in a fluid-tight manner by the O-ring 52. This makes it possible for a liquid casting to be filled into the opening, illustrated in FIG. 7, of the tunnel-shaped opening of the bearing shield, which casting hardens after filling and subsequently generates a thermal coupling between the bar-shaped part of the at least one phase terminal 30 and the bearing shield 50. For this purpose, the casting consists of a thermally conductive and electrically non-conductive, that is to say electrically insulating, material 53. Therefore, in one embodiment of the invention, an O-ring 52 can seal the thermally conductive and electrically insulating material 53 with respect to a section of the phase terminal 30 extending from the O-ring 52 in the direction of a stator 42 of the at least one electric machine 12. This makes it possible for the phase terminal 30 and thus a part of the power system to be thermally coupled to a part of the at least one electric machine 12 which is suitable for heat dissipation, which advantageously serves for cooling the power system and the at least one phase terminal 30.

Alternatively or additionally to the thermal coupling to the bearing shield 50 of an electric drive 10, the casting can additionally produce a thermal coupling to a heat sink 51 of the electric drive 10. In this embodiment, the thermal coupling by the casting is configured identically to the above-described form of the thermal coupling to a bearing shield 50, with the result that the preceding aspects can likewise apply to the heat sink, through the opening of which the phase terminal 30 can extend correspondingly. Both in the case of the thermal coupling of the phase terminal 30 by the casting to the bearing shield 50 or to the heat sink 51, it is not absolutely necessary for the phase terminal 30 to be guided through a tunnel-shaped opening. Instead, it is necessary for the phase terminal to run at least partially along a surface of the bearing shield or of the heat sink, with the result that a contact surface is present as an interface for heat transfer between these components, with which a certain mechanical fixing is automatically accompanied.

Although a casting is mentioned above, the casting does not necessarily have to be produced by casting an above-described material. The casting can also be produced by other suitable production processes, by means of which a thermal coupling and electrical insulation, as described above, between the phase terminal 30 and the bearing shield 50 and/or the heat sink 51 of the electric machine 12 can be achieved.

In one embodiment, semiconductor switch terminals 71 can electrically and/or thermally couple the at least one semiconductor switch 70 of the assembly 43 to at least one busbar conductor 21, 22 of the busbar system 20. In order that the semiconductor switch terminals make possible a sufficient heat dissipation, they can be configured in a flat bar-like shape, as illustrated in FIG. 7. This shape has wide side surfaces, which make possible a large-area contacting of the semiconductor switch terminals 71 to the at least one semiconductor switch 70. As a result, the contact or convection area can advantageously be increased, which leads to an improved heat-conducting effect.

The busbar conductors of the busbar system 20 are not illustrated in FIG. 7. As illustrated in FIGS. 5 and 6, however, the busbar conductors can comprise recesses through which the part of the phase terminal 30, which extends along the assembly 43, can pass and can thus protrude beyond the busbar conductors of the busbar system 20, as illustrated in FIG. 3. This makes it possible for the assembly 43 to bear directly against at least one busbar conductor 21, 22 of the busbar system 20 and thus to be thermally coupled thereto.

In contrast to the illustration in FIG. 7, the assembly 43 can be arranged not only directly on a heat sink 51 of the at least one electric machine 12, but also directly on a bearing shield 50 of the at least one electric machine 12. The heat sink 51 can be omitted in such an embodiment.

Figure 8:
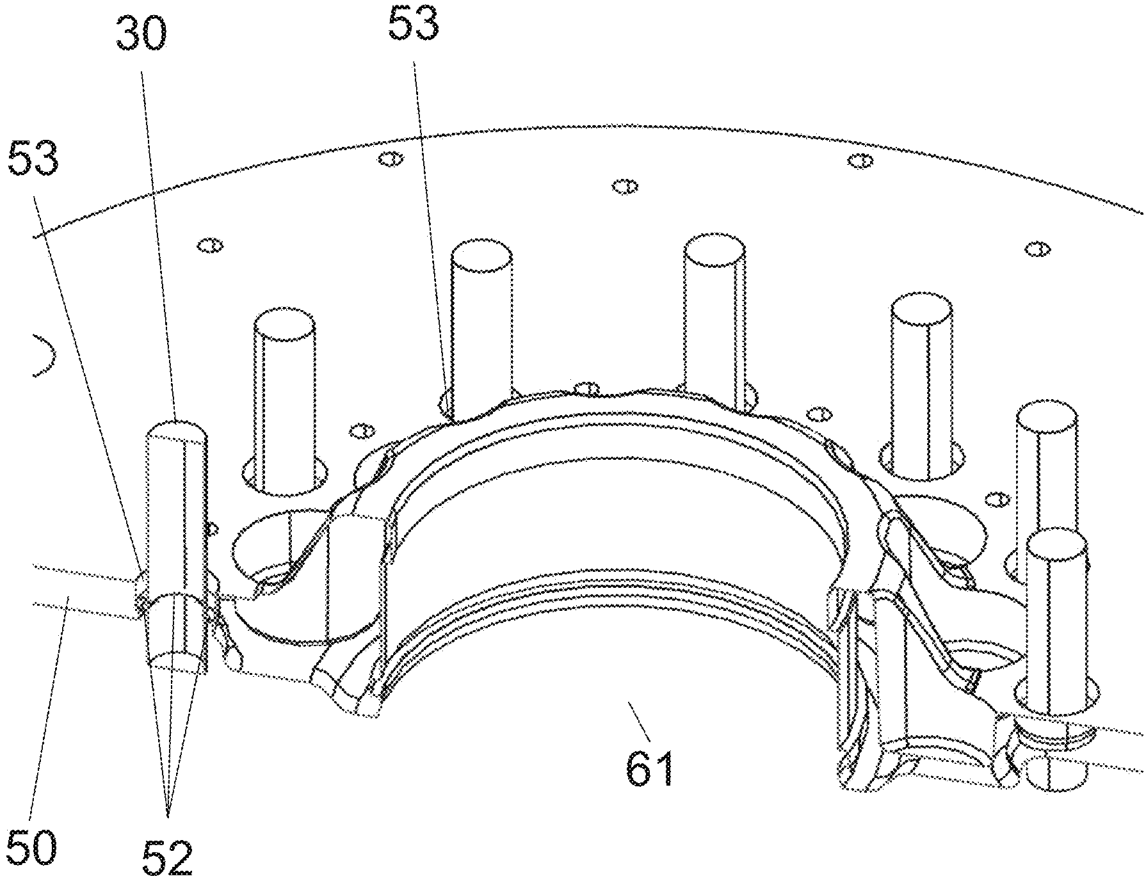
FIG. 8 shows a part of an electric drive in a perspective view.

FIG. 8 shows a part of an electric drive 10 in a perspective view, similar to FIG. 7, illustrating a cut through a cross-section of the at least one phase terminal 30, thereby show-ing O-ring 52 which encloses the bar-shaped part and can be arranged around the bar-shaped part of the at least one phase terminal 30 (as described with respect to FIG. 7 above). It also shows the electrically insulating material 53 that may be created by filling into the tunnel-shaped opening of the bearing shield through which the at least one phase terminal 30 can run (as described with respect to FIG. 7 above).

In all of the embodiments described above, a thermal coupling can be achieved by a means suitable for heat transfer. In particular, this can be a thermal interface material, TIM, which is familiar to the person skilled in the art. Such a material can serve, in addition to the thermal coupling, for electrical insulation if it is electrically non-conductive. It is therefore possible to couple a heat sink, such as a bearing shield 50 of an electric machine 12, or a heat sink 51 of an electric machine 12 to structural members or components to be cooled, without the risk of an unwanted short circuit arising in the process. This is advantageous in particular if the elements, components or structural members to be cooled are electrically or current-conductive. Likewise, the bearing shield 50 or the heat sink 51 can be produced from an electrically non-conductive material in order to achieve the same effect, such that a direct coupling between electrical or electronic components or structural members with the heat sink is made possible.

LIST OF REFERENCE SIGNS

10 Electric drive
11 Converter
12 Electric machine
13 Connection box
14 galvanic coupling
15 housing
16 machine shell
20 busbar system
21 front busbar
22 rear busbar
23 front busbar terminal lug
24 rear busbar terminal lug
25 recess
30 phase terminal
40 slot bar
41 slot
42 stator
43 assembly
50 bearing shield
51 heat sink
52 O-ring
53 thermally conductive and electrically insulating material
60 capacitor
61 rotation axis
70 semiconductor switch
71 semiconductor switch terminals

The invention claimed is:

1. An electric drive, comprising:

at least one electric machine; and at least one converter with at least one power system, configured to supply power to the at least one electric machine and comprising:

a busbar system, which is electrically conductively coupled to a DC power source;

at least one capacitor, which is electrically conductively coupled to the busbar system;

at least one semiconductor switch, which is electrically conductively coupled to the busbar system; and at least one phase terminal, which is electrically conductively coupled to the at least one semiconductor switch;

wherein the at least one phase terminal is thermally conductively coupled by a thermally conductive and electrically insulating material to at least a bearing shield and/or a heat sink of the electric machine in order to dissipate heat from the at least one phase terminal.

2. The electric drive according to claim 1, wherein the electric drive comprises a housing with a machine shell, wherein the at least one electric machine, the at least one converter, the busbar system, the at least one capacitor, the at least one semiconductor switch and the at least one phase terminal are arranged in the housing.

3. The electric drive according to claim 1, wherein:

at least one portion of the electric machine to which the at least one power system is thermally conductively coupled is a machine shell of the at least one electric machine and/or at least one surface-enlarging structure which is arranged on the machine shell and/or the bearing shield of the at least one electric machine and/or the heat sink of the electric machine; and/or the at least one portion of the at least one power system is thermally conductively coupled to at least one connection lug of the busbar system which is thermally conductively coupled to the machine shell in order to dissipate heat from the at least one portion of the at least one power system.

4. The electric drive according to claim 1, wherein the busbar system comprises a DC connection terminal which can be electrically conductively coupled to the DC power source; and wherein the busbar system further comprises a bent extension forming at least one connection lug arranged outside a machine shell of the at least one electric machine; or a bent extension forming at least one connection lug arranged outside the machine shell of the at least one electric machine in a connection box, wherein the connection box is arranged on the machine shell; or is arranged on the bearing shield and/or the heat sink of the electric machine and is cooled by the bearing shield and/or the heat sink.

5. The electric drive according to claim 1, wherein the at least one phase terminal supplies alternating current to at least one slot bar in a stator of the at least one electric machine.

6. The electric drive according to claim 1, wherein the busbar system comprises at least two busbar conductors insulated from one another.

7. The electric drive according to claim 6, wherein the insulation between the busbar conductors comprises channels for cooling the busbar conductors, wherein the channels comprise walls which are defined in part by the busbar system and in part by the insulation, and wherein a cooling medium is guided through the channels.

8. The electric drive according to claim 6, wherein the at least two busbar conductors are at least two conductors lying on top of one another, the at least two conductors comprising:

a closer conductor arranged closer to the heat sink; and a further conductor arranged further from the heat sink than the closer conductor;

wherein the closer conductor comprises recesses through which the further conductor is thermally coupled directly to the heat sink.

9. The electric drive according to claim 1, wherein an O-ring seals the thermally conductive and electrically insulating material with respect to a section of the phase terminal extending from the O-ring in a direction of a stator of the at least one electric machine.

10. The electric drive according to claim 1, wherein at least one thermal coupling is formed by the thermally conductive and electrically non-conductive material, or by a thermal interface material, TIM.

11. The electric drive according to claim 1, wherein the power system is cooled by the bearing shield and/or the heat sink of the electric machine in that the at least one capacitor is coupled in an electrically insulating and thermally conducting manner to the bearing shield and coupled in a thermally and electrically conducting manner to the busbar system; and/or the at least one semiconductor switch is coupled in a thermally conducting manner to the bearing shield and coupled in a thermally and electrically conducting manner to the busbar system; and/or the at least one semiconductor switch is coupled in a thermally conducting manner to the heat sink and coupled in a thermally and electrically conducting manner to the busbar system; and/or the busbar system is directly cooled by an electrically non-conductive, liquid cooling medium; and/or a DC connection terminal is coupled in a thermally conducting manner to the bearing shield of the electric machine; and/or surface-enlarging structures which are arranged on the bearing shield of the electric machine are actively cooled.

12. The electric drive according to claim 1, wherein the at least one power system or a portion of the at least one power system is actively cooled by an actively cooled machine shell and/or an actively cooled bearing shield of the electric machine and/or by a heat sink with cooling channels.

13. The electric drive according to claim 1, wherein at least one galvanic coupling which couples the DC power source in an electrically conducting manner to the power system is thermally coupled to the power system and is cooled via at least one portion of the electric machine.

14. The electric drive according to claim 1, wherein the bearing shield of the electric machine is magnetically non-conductive and thermally conductive and/or electrically non-conductive and thermally conductive.

* * * * *